(12) United States Patent
White et al.

(10) Patent No.: US 9,923,548 B1
(45) Date of Patent: Mar. 20, 2018

(54) SWITCHED MODE NEGATIVE INDUCTOR

(71) Applicant: HRL Laboratories, LLC, Malibu, CA (US)

(72) Inventors: Carson R. White, Agoura Hills, CA (US); Brian Hughes, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 155 days.

(21) Appl. No.: 15/098,259

(22) Filed: Apr. 13, 2016

Related U.S. Application Data

(60) Provisional application No. 62/146,964, filed on Apr. 14, 2015.

(51) Int. Cl.
*H03H 11/48* (2006.01)
*H03H 11/10* (2006.01)

(52) U.S. Cl.
CPC ............. *H03H 11/48* (2013.01); *H03H 11/10* (2013.01)

(58) Field of Classification Search
CPC .................... H03H 11/10; H03H 11/40–11/53
USPC .................................................. 333/213–217
See application file for complete search history.

(56) References Cited

U.S. PATENT DOCUMENTS

| | | | |
|---|---|---|---|
| 5,402,133 A | 3/1995 | Merenda | |
| 6,229,494 B1 | 5/2001 | Merenda | |
| 7,020,450 B2 * | 3/2006 | Desclos | H03H 11/48 327/113 |
| 7,068,130 B2 * | 6/2006 | Redoute | H03H 11/50 333/214 |
| 7,154,250 B2 * | 12/2006 | Vinciarelli | H02M 3/1582 323/239 |
| 8,242,863 B2 * | 8/2012 | Schmitz | H03H 11/42 333/214 |
| 8,766,746 B2 * | 7/2014 | Nedovic | H03H 11/48 333/213 |
| 8,988,173 B2 | 3/2015 | Hitko et al. | |
| 9,054,798 B2 * | 6/2015 | Xu | H04B 1/0458 |

OTHER PUBLICATIONS

C. R. White, J. W. May and J. S. Colburn, "A Variable Negative-Inductance Integrated Circuit at UHF Frequencies," IEEE MWCL, 22(1), 35-37, 2012.

(Continued)

*Primary Examiner* — Dean Takaoka
*Assistant Examiner* — Alan Wong
(74) *Attorney, Agent, or Firm* — Ladas & Parry

(57) ABSTRACT

A switched mode negative inductance circuit includes an input node responsive to a voltage signal. The circuit also includes first and second voltage sources, first and second controlled switches having first poles coupled to the first and second voltage sources, respectively and an inductor having a first electrode coupled to second poles of the first and second controlled switches and a second electrode coupled to the input node. The input node is coupled to a control electrode of the first controlled switch, and to a control electrode of the second controlled switch through a voltage inverting circuit. The disclosure also illustrates balanced negative inductance circuits and implementation approaches using NMOS transistors.

17 Claims, 6 Drawing Sheets

(56) References Cited

OTHER PUBLICATIONS

Sussman-Fort and R. M. Rudish, "Non-Foster impedance matching of electrically-small antennas to transmitters," in proc. Antenna Applications Symp., Allerton Park, IL, pp. 2230-22441, Aug. 2009.
Merenda, "Waveform-synthesis method that reduces battery power in an electrically small wideband radiating system," IET Microw. Antennas Propag., 2(1), 59-65, 2008.
U.S. Appl. No. 13/177,479, filed Jul. 2011, White et al.

* cited by examiner

SWITCHED MODE NEGATIVE INDUCTOR

CROSS REFERENCE TO RELATED APPLICATIONS

This application claims the benefit of U.S. Provisional Patent Application No. 62/146,964, filed Apr. 14, 2015, which is incorporated herein by reference in its entirety.

TECHNICAL FIELD

The present invention is in the field of circuit synthesis and in particular relates to a circuit that synthesizes a negative inductance.

BACKGROUND OF THE DISCLOSURE

There are a variety of applications where canceling inductive reactance over a wide frequency bands are required. Such applications can benefit from negative inductance circuits to offset the inductive reactance and provide for efficient power transfers. Examples of such applications include systems with small transmit antennas, and in particular to antennas at and below VHF frequencies. In order to operate efficiently, antennas must be matched to the transmitting circuitry.

Large antennas are more easily matched because they operate at a relatively low Q factor. However, full size antennas are often times not feasible on mobile platforms such as aircraft. This necessitates use of compact antennas with their associated high Q.

One approach to providing matching for compact antennas is to resonate the load with capacitance. The disadvantage is that it results in an extremely narrowband performance for high-Q loads, such as compact antennas, and is not useful if wideband performance is required. In addition, performance outside the band of interest results in extremely poor performance.

Another approach to drive an antenna is either unmatched or with lossy matching. This approach has extremely low power efficiency. Large and expensive power amplifiers and cooling systems are needed to generate and dissipate RF power. The unmatched case complicates amplifier design because it must handle reflected power, while lossy matching further reduces efficiency.

The use of small signal non-Foster circuits to match antennas has been tried. Such use does not extend to high power levels due to their high power dissipation, leading to low efficiency.

The use of resonant non-Foster circuits overcomes the high voltage problem by resonating the load then canceling the reactance with a resonant non-Foster circuit. At the resonant frequency, the voltage across the NFC is zero; however, this voltage quickly rises above and below the resonant frequency. Therefore, the high power efficiency is only realized over a bandwidth comparable to passive matching.

Waveform synthesis methods do not attempt to resonate the antenna but instead simply drive it with an on-off waveform. The two main disadvantages are a) it requires digital synthesis control and does not respond to an input waveform and b) the antenna is not resonated and must essentially be driven by a voltage source. This gives no flexibility to obtain the desired frequency response.

Linear non-Foster circuits (NFCs) are based on the concept of impedance and are well known. Current negative inductance circuits, often referred to as non-Foster circuits because they break Foster's reactance theorem, use amplifiers, transistors operating in small signal transconductance mode or negative resistances to generate a small-signal impedance approximating $j\omega L$, where L is negative. These circuits are typically biased in class A, meaning that they constantly draw DC current and dissipate DC power.

The current small signal circuits do not extend to the large signal regime applicable to transmit antennas because of the high-voltage problem. Consider power delivery to a reactive load with impedance $Z=R+jX$ with $X \gg R$ and a quality factor $Q=X/R$. The power delivered to the load is $I^2 \ast R$ and the magnitude of the voltage across the load is approximately $I \ast X$. One may employ an NFC to "resonate" the load over a wide bandwidth, giving an input impedance $Z'=R+jX-jX=R$. Now the current flowing through the NFC is I, resulting in a voltage of $I \ast X$. The active devices must be biased with enough headroom to handle both the current I and the voltage $I \ast X$. This means that while the NFC dissipates no RF power, the DC power dissipation is $I^2 \ast X$, which is Q times the RF power delivered to the load. Resonant NFCs have been proposed to solve this problem, but the power efficiency is obtainable only over a narrowband.

In short, passive networks can only match an antenna for discrete frequencies and resonating loads with capacitance leads to narrowband responses. NFC circuits are either inherently narrow band or dissipate proportionally high DC power, hence less efficient.

Hence, there is a compelling need in the field of circuit synthesis for simple and efficient negative inductance circuits that can operate at high power levels with high efficiency over a wide frequency band. Such circuits will allow the use of compact antennas for wideband applications.

SUMMARY OF THE DISCLOSURE

To address one or more of the above-deficiencies of the prior art, one embodiment described in this disclosure provides a switched mode negative inductance with a wide band performance at high power levels.

In accordance with principles of the present invention a switched mode negative inductance circuit includes an input node responsive to a voltage signal. The circuit also includes first and second voltage sources, first and second controlled switches having first poles coupled to the first and second voltage sources, respectively and an inductor having a first electrode coupled to second poles of the first and second controlled switches and a second electrode coupled to the input node. The input node is coupled to a control electrode of the first controlled switch, and to a control electrode of the second controlled switch through a voltage inverting circuit.

A negative inductance circuit in accordance with the present invention dissipates very little DC power when driven by a square wave. While power is sourced from the power supplies during part of the cycle, it is returned during other parts of the cycle.

The negative inductance circuit operates in a switching mode, and comprises positive and negative power supplies, two switches, a model inductance Lm, an input terminal and a ground terminal. The voltage at the input terminal is sensed and controls the switches such that current flows out of the input terminal when the input voltage is positive and into the input terminal when the input voltage is negative. The negative inductance behavior is observed when driven by a voltage square wave.

A negative inductance circuit according to the present invention extends non-Foster circuits to permit matching to high power levels and is a significant departure from the linear concept of impedance. Instead, such a circuit produces a negative inductance response to a square wave rather than a sine wave. Current traditional NFCs cannot be combined with the waveform synthesis method because the traditional NFCs require devices to behave like amplifiers. The topology disclosed here is different than traditional NFCs.

Certain embodiments may provide various technical advantages depending on the implementation. For example, a technical advantage of some embodiments may include the capability to provide negative inductance at high power levels while other embodiments provide impedance matching at broad bands.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

It should be understood at the outset that, although example embodiments are illustrated below, the present invention may be implemented using any number of techniques, whether currently known or not. The present invention should in no way be limited to the example implementations, drawings, and techniques illustrated below. Additionally, the drawings are not necessarily drawn to scale.

The principles of this invention is the synthesis of negative inductance circuits that can provide for efficient high power and broad band performance. Negative inductance can be illustrated by the following equation:

$$\frac{dI}{dt} = \frac{V}{L} < 0 \qquad (1)$$

where I is the current through the device, t is time, V is the voltage across the terminals and L<0 is the inductance.

An embodiment of the present invention is a circuit that synthesizes a negative inductance in a switching mode. In an embodiment of this inventive concept, the negative inductance behavior is observed when driven by a voltage square wave. Negative inductance is described by equation (1) above.

Figure 1:
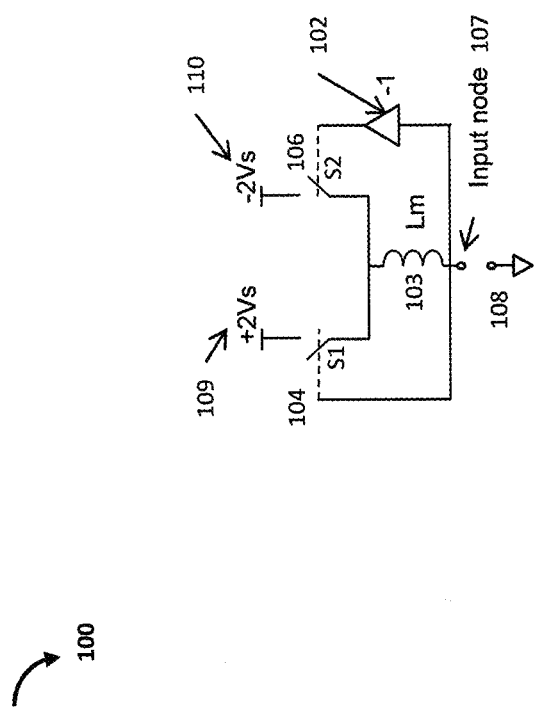
FIG. 1 illustrates a schematic diagram of a negative inductance circuit according to principles of the present invention.

FIG. 1 illustrates a schematic diagram of a switched mode negative inductance circuit 100 according to principles of the present invention. In FIG. 1, Vs represents a specified supply voltage (e.g. 30 volts in the illustrated embodiment). A positive DC power supply 109 with voltage +2Vs (e.g. +60 volts) with respect to a ground node is coupled to a first pole of a first switch S1 (104). A second pole of the first switch S1 (104) is coupled to a first electrode of a model inductance Lm (103). A negative DC power supply 110 with voltage −2Vs (e.g. −60 volts) with respect to a ground node is coupled to a first pole of a second switch S2 (106). The second pole of the second switch S2 (106) is also coupled to the first electrode of the model inductance Lm (103). The second electrode of the model inductance Lm (103) is coupled to a first input terminal 107 of an input node. A second input terminal 108 of the input node is coupled to a reference potential (ground). The first input terminal 107 of the input node is coupled to a control electrode of the first switch S1 (104), and to an input terminal of an inverting amplifier 102. An output terminal of the inverting amplifier 102 is coupled to a control electrode of the second switch S2 (106).

In operation, the switches S1 104 and S2 106 are configured such that they close when the voltage at their respective control electrode is positive and open when it is negative, and the control electrodes have impedance much greater than $2\pi f L_m$ where f is the frequency. The inverter also needs high input impedance. In the illustrated embodiment, the first switch S1 104 is controlled by the signal at the input node whereas the second switch S2 106 is controlled by the signal from the voltage inverting amplifier. Negative inductance is observed between the input node 107 and the ground node 108.

Figure 2:
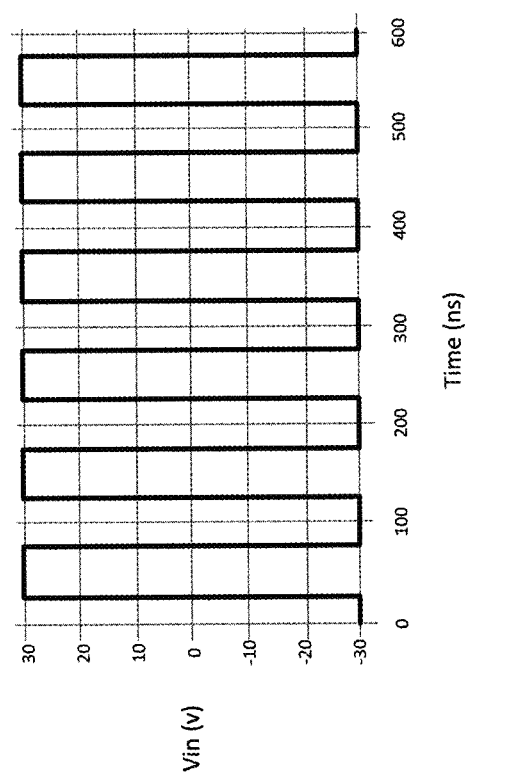
FIG. 2, FIG. 3 and FIG. 4 illustrate waveform diagrams that help in understanding the operation of a negative inductance circuit according to principles of the present invention.
Figure 3:
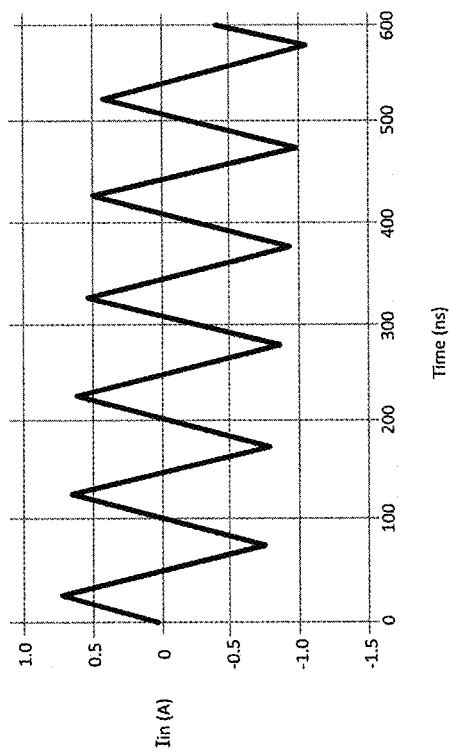
Figure 4:
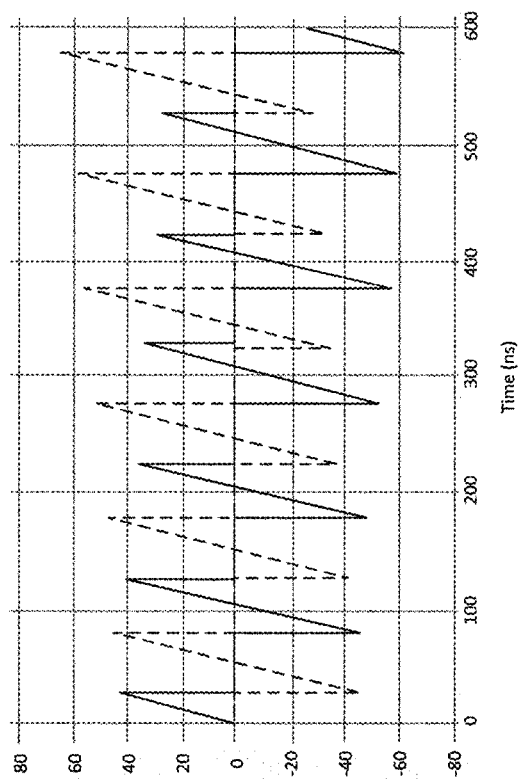

FIG. 2 is a waveform diagram of a square wave input voltage varying between +Vs and −Vs (e.g. ±30 volts in the illustrated embodiment) used as an input signal applied at the input node 107 to the negative inductance circuit 100 according to principles of the present invention. FIG. 3 is a waveform diagram of the input current waveform Iin at the input node 107, where Iin>0 signifies that the current is sinking current. FIG. 4 is a waveform diagram of the instantaneous power flow out of the positive (109) (dashed line) and negative (110) (solid line) DC power supplies. FIG. 2, FIG. 3 and FIG. 4 will be referred to below to describe the operation of the negative inductance circuit of FIG. 1.

The square wave of FIG. 2, varying between +Vs and −Vs (e.g. +30 volts and −30 volts, respectively), is applied between the input terminal 107 and ground terminal 108. At time zero, there is no current flowing in the inductor Lm. For the first quarter period, the input voltage is −Vs; therefore, S1 104 is open and S2 106 is closed, applying voltage −Vs/across the inductor Lm. This induces an input current Iin (at the input terminal 107) with derivative:

$$\frac{dI_{in}}{dt} = \frac{-Vs}{-Lm} \qquad (2)$$

as illustrated in FIG. 3. The derivative of equation (2) behaves identically to an inductor with inductance −Lm. During this time, power flows out of the negative supply 110 since the positive input current flows into it, as illustrated in the first quarter cycle by the solid line in FIG. 4.

For the next half cycle, the input voltage is +Vs, thus S1 104 is closed and S2 106 is open. This puts a voltage of +Vs across Lm, inducing an input current (at the input terminal 107) with derivative:

$$\frac{dI_{in}}{dt} = \frac{Vs}{-L_m} \quad (3)$$

Again, this behaves like an inductance −Lm. For the second quarter of the cycle, the current flows into the positive supply 109, delivering power to the supply, while for the third quarter of the cycle, the current is reversed and power flows out of the positive supply 109, as illustrated by the dashed line in FIG. 4. As time progresses, energy flows into and out of the power supplies 109 and 110 but it is not dissipated. In a real system, some energy is dissipated by Ohmic and radiative losses.

For a square wave between +Vs and −Vs (FIG. 2), the circuit acts as a negative inductance with value −Lm. For a general waveform $V_{in}(t)$, the instantaneous voltage across Lm is:

$$+2Vs - V_{in}(t) \text{ when } V_{in}(t) > 0$$

and $$-2Vs - V_{in}(t) \text{ when } V_{in}(t) < 0 \quad (4)$$

For simplicity, consider the case $V_{in}(t) > 0$. This leads to input currents with derivative:

$$\frac{dI_{in}}{dt} = \frac{2Vs - V_{in}(t)}{-L_m} \quad (5)$$

If $V_{in}(t)$ is a square wave with amplitude other than ±V the result is an effective inductance with value other than Lm $$L_{eff} = \frac{V_{in}}{dI/dt} = V_{in} \frac{-L_m}{2Vs - V_{in}} \quad (6)$$

The effective inductance $L_{eff}$ varies from 0 to −∞ as $V_{in}$ varies from 0 to 2Vs, and reduces to −Lm if $V_{in}$=Vs. If $V_{in}(t)$ is sinusoidal or any other waveform, the inductance is not constant, potentially introducing distortion.

Figure 5:
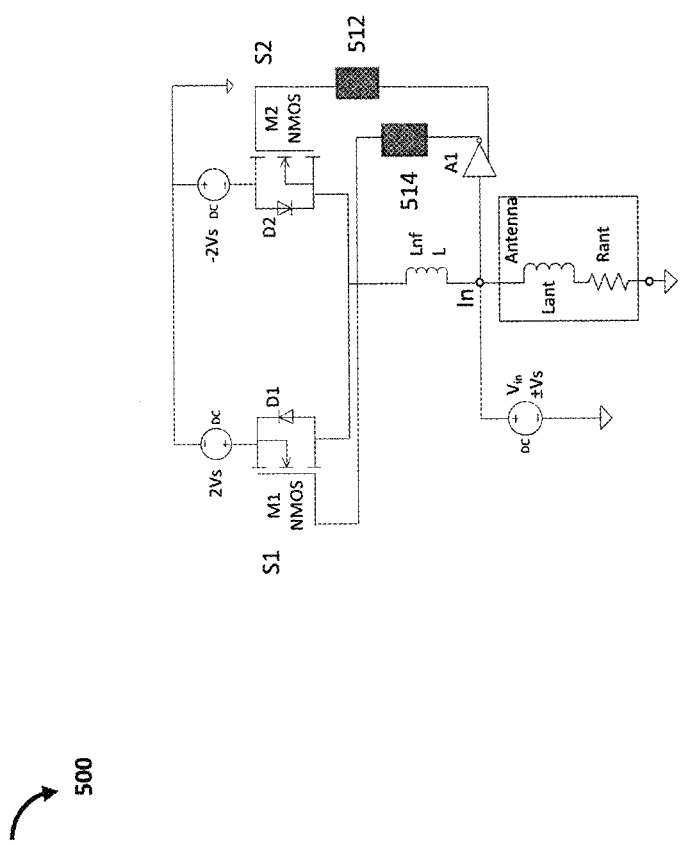
FIG. 5 illustrates a schematic diagram of a single-ended embodiment of a negative inductance circuit in accordance with principles of the present invention.

FIG. 5 illustrates a schematic diagram of a transistor-level description of a single-ended embodiment of a negative inductance circuit 500 in accordance with principles of the present invention. In FIG. 5, switches S1 and S2 (of FIG. 1) are implemented as N-channel FETs M1 and M2, respectively. The main conductive path of the FET M1 is coupled between a source of +2Vs and a first electrode of a model-inductor Lnf, and the main conductive path of the FET M2 is coupled between a source of −2Vs and the first electrode of the model-inductor Lnf. The FETs M1 and M2 are preferably insulating-gate GaN FETs.

Diodes D1 and D2 are coupled from source to drain of FETs M1 and M2, respectively, to solve problems due to imperfect switching timing. Specifically, the diodes prevent shoot thru current if both switches are on at the same time, and excessive voltage if both switches are off at the same time (as this condition would cause an abrupt change in inductor current). The control of M1 and M2 requires a dead-time when both M1 and M2 are off to prevent shoot through current. The diodes allow current flow during the dead-time, and prevent voltage spikes. S1 NMOSFET have parallel body diodes. Additional diodes can be put in parallel to improve circuit efficiency.

A second electrode of the inductance Lnf is coupled to an input terminal In. A source of an input signal $V_{in}$ is also coupled to the input terminal In. The input terminal In is coupled to an input terminal of a voltage inverter A1. An inverting output terminal of the voltage inverter A1 is coupled to the control electrode of FET M2 through a delay circuit 512 and a non-inverting output terminal of the voltage inverter A1 is coupled to the control electrode of FET M1 through a delay circuit 514. The delay circuits 512 and 514 provide a delay in the control signal turning on M2 and M1, respectively. Such delay circuits are known to those skilled in the art and will not be described in detail below. In the embodiment illustrated in FIG. 5, an antenna is illustrated as coupled to the input terminal In, and is represented by an equivalent circuit comprising an antenna inductance Lant and an antenna resistance Rant. One skilled in the art understands that FETs M1 and M2 could be paired NMOS and PMOS FETs, obviating the requirement for voltage inverter A1.

In operation, an efficient switching sequence is as follows:
M1 is switched on, increasing the current:
M1 is switched off and the deadtime circuit 512 delays turning on M2. During this time, the current in the model-inductor Lnf discharges the parasitic capacitance of the switches M1 and M2 until the voltage at the model-inductance Lnf node is <−2Vs minus a diode voltage and D2 turns on;
M2 is switched on without switching loss, decreasing the current until the −2Vs voltage supplied from the negative supply reverses dI/dt, i.e. the Lnf current becomes negative:
M2 is switched off and the deadtime circuit 514 delays turning on M1. During this time the current in the model-inductor Lnf charges the parasitic capacitance of the switches M1 and M2 to +2Vs;
M1 is switched on with no switching loss, and the cycle repeats.

By switching in the manner described above, switching losses are minimized.

Figure 6:
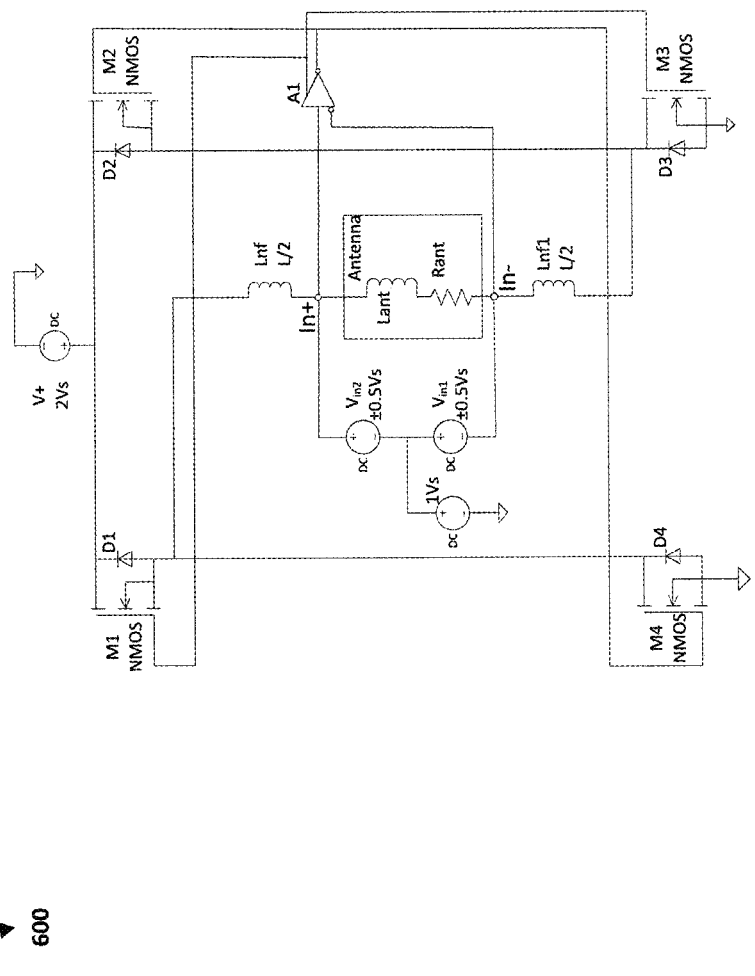
FIG. 6 is a schematic diagram of a differential embodiment of a negative inductance circuit in accordance with principles of the present invention.

FIG. 6 is a schematic diagram of a differential embodiment of a negative inductance circuit 600 in accordance with principles of the present invention. In general, the negative inductance circuit of FIG. 5 is made differential by mirroring to a negative side. In FIG. 6, a voltage supply V+ with voltage +2Vs is coupled to ground through the series connection of the main conductive paths of FETs M1 and M4 and through the series connection of the main conductive paths of FETs M2 and M3. The junction of the main conductive paths of FETs M1 and M4 is coupled to a first electrode of a first inductor Lnf, having inductance L/2. A second electrode of the first inductor Lnf is coupled to a first input terminal In+. The junction of the main conductive paths of FETs M2 and M3 is coupled to the first electrode of a second inductor Lnf1, also having an inductance L/2, and a second electrode of the second inductor Lnf1 is coupled to a second input terminal In−. The connection of M1-M4 forms a full bridge. Inductances Lnf and Lnf1 are coupled between the left and right branches of that bridge, respectively.

Input voltages $V_{in1}$ and $V_{in2}$, each with magnitude ±0.5Vs are connected in series with the junction node set to a DC offset of 1Vs. The differential input signal is applied between input terminals In+ and In−. The input terminal In+ is coupled to a non-inverting input terminal of differential amplifier A1, and the input terminal In− is coupled to an inverting input terminal of the differential amplifier A1. A non-inverting output terminal of the differential amplifier A1 is coupled to respective control electrodes of FETs M1 and M3, and an inverting output terminal of the differential amplifier A1 is coupled to respective control electrodes of FETs M2 and M4. In the embodiment illustrated in FIG. 6 an antenna is coupled between the input terminals In+ and In−, and is illustrated by an equivalent circuit comprising an antenna inductance Lant and an antenna resistance Rant.

In operation, differential amplifier A1 senses the input voltages at input terminals In+ and In− and switches the FETs M1-M4 between conductive and non-conductive states. If the voltage at input terminal In+ is higher than the voltage at input terminal In−, M1 and M3 are made conductive, M2 and M4 are made non-conductive, and $dI_{in}/dt$ is negative. If the voltage at input terminal In+ is lower than the voltage at input terminal In−, M2 and M4 is made conductive, M and M3 are made non-conductive, and $dI_{in}/dt$ is positive.

Using the inventive concepts presented herein, one skilled in the art can generate a variety of variations of the circuits illustrated herein and these variations in the circuit synthesis are intended to be part of this invention.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A negative inductance circuit, comprising:
   an input node responsive to a voltage signal;
   first and second voltage sources;
   first and second controlled switches having first poles coupled to the first and second voltage sources, respectively; and
   an inductor having a first electrode coupled to second poles of the first and second controlled switches and a second electrode coupled to the input node, wherein
   the input node is coupled to a control electrode of the first controlled switch, and to a control electrode of the second controlled switch through an inverting circuit.

2. The circuit of claim 1, wherein
   the first voltage source is a source of a positive voltage; and
   the second voltage source is a source of a negative voltage.

3. The circuit of claim 1, wherein the first and second controlled switches are switched on when the signal at the control electrode is positive and switched off when the signal at the control electrode is negative.

4. The circuit of claim 3, wherein
   the first controlled switch comprises a first FET transistor wherein the first pole of the first controlled switch is the drain electrode of the first transistor, the second pole of the first controlled switch is the source electrode of the first transistor and the control electrode of the first controlled switch is the gate electrode of the first transistor, and wherein the main conduction path of the first transistor is made conductive if the signal at the gate electrode is positive and made non-conductive if the signal at the gate electrode is negative; and
   the second controlled switch comprises a second FET transistor wherein the first pole of the second controlled switch is the source electrode of the second transistor, the second pole of the second controlled switch is the drain electrode of the second transistor and the control electrode of the second controlled switch is the gate electrode of the second transistor, and wherein the main conductive path of the second transistor is made conductive if the signal at the gate electrode is positive and made non-conductive if the signal at the gate electrode is negative.

5. The circuit of claim 4 wherein the first and second FET transistors are NMOS transistors.

6. The circuit of claim 5 wherein the first and second NMOS transistors are insulating-gate GaN FET transistors.

7. The circuit of claim 4 further comprising:
   a first diode having an anode electrode coupled to the source electrode of the first transistor, and a cathode coupled to the drain electrode of the first transistor; and
   a second diode having an anode electrode coupled to the source electrode of the second transistor, and a cathode coupled to the drain electrode of the second transistor.

8. A balanced negative inductance circuit, comprising:
   a balanced input node comprising first and second input terminals responsive to a voltage signal;
   a voltage source;
   series coupled first and second controlled switches coupled between the voltage source and a source of reference potential;
   series coupled third and fourth controlled switches coupled between the voltage source and the source of reference potential;
   a first inductor coupled between the junction of the first and second controlled switches and the first input terminal of the input node; and
   a second inductor coupled between the junction of the third and fourth controlled switches and the second input terminal of the input node, wherein
   the first and second terminals of the input node are coupled to non-inverting and inverting input terminals of a voltage sensing circuit, respectively, a non-inverting output terminal of the voltage sensing circuit is coupled to the control electrodes of the first and fourth controlled switch, and an inverting output terminal of the voltage sensing circuit is coupled to the control electrodes of the second and third controlled switch.

9. The circuit of claim 8, wherein the voltage source is a source of a positive voltage.

10. The circuit of claim 8, wherein the first, second, third and fourth controlled switches are switched on when the signal at the control electrode is positive and switched off when the signal at the control electrode is negative.

11. The circuit of claim 10, wherein
   the first and fourth controlled switches are switched on when the signal at the first input terminal of the input node has a higher voltage than the signal at the second input terminal of the input node; and
   the second and third controlled switches are switched on when the signal at the second input terminal of the input node has a higher voltage than the signal at the first input terminal of the input node.

12. The circuit of claim 8, wherein:
the series coupled first and second controlled switches comprise a first and a second FET transistor having series coupled main conductive paths, wherein
the control electrode of the first controlled switch is the gate electrode of the first transistor, and the main conduction path of the first transistor is made conductive if the signal at the gate electrode is positive and made non-conductive if the signal at the gate electrode is negative;
the control electrode of the second controlled switch is the gate electrode of the second transistor, and the main conductive path of the second transistor is made conductive if the signal at the gate electrode is positive and made non-conductive if the signal at the gate electrode is negative; and
the series coupled third and fourth controlled switches comprise a third and a fourth FET transistor having series coupled main conductive paths, wherein
the control electrode of the third controlled switch is the gate electrode of the third transistor, and the main conduction path of the third transistor is made conductive if the signal at the gate electrode is positive and made non-conductive if the signal at the gate electrode is negative; and
the control electrode of the fourth controlled switch is the gate electrode of the fourth transistor and the main conductive path of the fourth transistor is made conductive if the signal at the gate electrode is positive and made non-conductive if the signal at the gate electrode is negative.

13. The circuit of claim 12 wherein the first, second, third and fourth FET transistors are NMOS transistors.

14. The circuit of claim 13 wherein the first, second, third and fourth NMOS transistors are insulating-gate GaN FET transistors.

15. The circuit of claim 12 further comprising:
a first diode coupled across the main conductive path of the first transistor;
a second diode coupled across the main conductive path of the second transistor;
a third diode coupled across the main conductive path of the third transistor; and
a fourth diode coupled across the main conductive path of the fourth transistor.

16. A switched mode negative inductance circuit, comprising:
an input node responsive to a voltage signal $V_{in}$;
an inductor having a value Lm; and
circuitry for:
sensing the polarity of the voltage at the input node;
supplying a current I to the input node having a value satisfying $dI/dt=-V_{in}/Lm$ if the voltage $V_{in}$ at the input node $V_{in}$ is positive; and
sinking a current I from the input node having a value satisfying $dI/dt=-V_{in}/Lm$ if the voltage $V_{in}$ at the input node is negative.

17. In a circuit comprising an input node responsive to a voltage signal $V_{in}$, and an inductance having a value Lm, a method for synthesizing a negative inductance comprising:
sensing the polarity of the voltage signal at the input node;
supplying a current I to the input node having a value satisfying $dI/dt=-V_{in}/Lm$ if the voltage $V_{in}$ at the input node $V_{in}$ is positive; and
sinking a current I from the input node having a value satisfying $dI/dt=-V_{in}/Lm$ if the voltage $V_{in}$ at the input node is negative.

* * * * *